(12) United States Patent
Kim

(10) Patent No.: US 8,026,586 B2
(45) Date of Patent: Sep. 27, 2011

(54) SEMICONDUCTOR PACKAGE

(75) Inventor: Jong Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 94 days.

(21) Appl. No.: 12/647,640

(22) Filed: Dec. 28, 2009

(65) Prior Publication Data

US 2011/0031600 A1 Feb. 10, 2011

(30) Foreign Application Priority Data

Aug. 10, 2009 (KR) .................. 10-2009-0073499

(51) Int. Cl.
*H01L 23/02* (2006.01)

(52) U.S. Cl. ............... 257/686; 257/777; 257/E25.006; 257/E25.013; 257/E25.021; 257/E25.027; 257/E23.085

(58) Field of Classification Search ............ 257/686, 257/777, E25.006, E25.013, E25.018, E25.021, 257/E25.027, E23.085; 438/109, FOR. 368
See application file for complete search history.

(56) References Cited

U.S. PATENT DOCUMENTS

| | | | | |
|---|---|---|---|---|
| 6,818,474 B2* | 11/2004 | Kim et al. | ...... | 438/108 |
| 7,875,499 B2* | 1/2011 | Yamano | ...... | 438/109 |
| 2007/0218588 A1* | 9/2007 | Takiar et al. | ...... | 438/109 |
| 2008/0083977 A1* | 4/2008 | Haba et al. | ...... | 257/686 |
| 2008/0150158 A1* | 6/2008 | Chin | ...... | 257/777 |
| 2009/0065948 A1 | 3/2009 | Wang | | |
| 2010/0148372 A1* | 6/2010 | Farnworth et al. | ...... | 257/777 |

FOREIGN PATENT DOCUMENTS

| | | |
|---|---|---|
| JP | 2009-194294 A | 8/2009 |
| KR | 1020060011370 A | 2/2006 |
| KR | 10-0876896 B1 | 12/2008 |
| KR | 1020090044496 A | 5/2009 |

* cited by examiner

*Primary Examiner* — Jasmine Clark
(74) *Attorney, Agent, or Firm* — Ladas & Parry LLP

(57) ABSTRACT

A semiconductor package comprises a substrate having bond fingers on an upper surface thereof and ball lands on a lower surface thereof; at least two chip modules stacked on the upper surface of the substrate, each of the at least two chip modules including a plurality of semiconductor chips having first connection members and stacked in a manner such that the first connection members of the semiconductor chips are connected to one another, the chip modules being stacked in a zigzag pattern such that connection parts of the chip modules project sideward; and second connection members electrically connecting the connection parts of the respective chip modules to the bond fingers of the substrate.

19 Claims, 7 Drawing Sheets

SEMICONDUCTOR PACKAGE

CROSS-REFERENCE TO RELATED APPLICATIONS

The present application claims priority to Korean patent application number 10-2009-0073499 filed on Aug. 10, 2009, which is incorporated herein by reference in its entirety.

BACKGROUND OF THE INVENTION

The present invention relates generally to a semiconductor package, and more particularly, to a semiconductor package which can be mounted with a plurality of semiconductor chips and can prevent the manufacturing yield from decreasing due to the defects of semiconductor chips.

In the semiconductor industry, packaging technology is continuously being developed to meet demands for miniaturization and mounting efficiency. Recently, as electric and electronic is products trend toward miniaturization and high performance, various techniques for stacking have been researched.

The term "stack" when referred to in the semiconductor industry means to vertically pile at least two chips or packages. By this stack technique, in the case of a memory device, it is possible to realize a product having a memory capacity at least two times greater than that obtainable through semiconductor integration processes, and mounting area utilization efficiency can be improved.

However, in the conventional semiconductor package (hereinafter referred to as a "stack package") manufactured using the stack technique, since signal connections to respective semiconductor chips are realized through metal wires, disadvantages are caused in that the operation speed of each semiconductor chip is diminished. Also, since an additional area for wire bonding is required in a substrate, the size of the package increases. In addition, a gap is required to bond wires to the bonding pads of the respective semiconductor chips causing an increased overall height.

In order to overcome the above disadvantages of the conventional stack package, a stack package structure using through-silicon vias (hereinafter referred to as "through-electrodes") has been suggested.

The stack package using through-electrodes is realized by forming through-electrodes in semiconductor chips, and then stacking a plurality of the semiconductor chips formed with the through-electrodes in a manner such that the through-electrodes of the respective semiconductor chips are electrically connected to one another.

The stack package using the through-electrodes provides advantages in that, since an additional area for forming electrical connections is not required in a substrate, mounting efficiency can be improved. Also, since a gap for wire bonding is not required between the semiconductor chips, the overall height of the semiconductor package can be decreased in comparison to the conventional art. In addition, because a signal connection length to each semiconductor chip is shortened, the operation speed of each semiconductor chip can be increased, whereby high speed operation of the semiconductor chip can be ensured.

Moreover, in the stack package using the through-electrodes, since the plurality of semiconductor chips can be mounted in one package, a multi-chip package having high performance and high capacity can be realized.

Nevertheless, in a conventional stack package using through-electrodes, if defects occur in even one of the stacked semiconductor chips, all of the stacked semiconductor chips must be discarded, whereby the manufacturing yield decreases. Due to this fact, in the conventional stack package using the through-electrodes, it is required that special attention be paid so that is defects are not caused in the individual semiconductor chips, whereby the manufacturing cost increases.

BRIEF SUMMARY OF THE INVENTION

Embodiments of the present invention include a semiconductor package which can be mounted with a plurality of semiconductor chips and can increase manufacturing yield.

In one embodiment of the present invention, a semiconductor package comprises a substrate having bond fingers on an upper surface thereof and ball lands on a lower surface thereof; at least two chip modules stacked on the upper surface of the substrate and each including a plurality of semiconductor chips having first connection members and stacked in a manner such that the first connection members of the semiconductor chips are connected to one another, the chip modules being stacked in a zigzag pattern such that connection parts including the first connection members of the chip modules project sideward; and second connection members configured to connect the first connection members of the respective chip modules and the bond fingers of the substrate.

The first connection members may comprise through-electrodes.

The second connection members may comprise metal wires.

The second connection members may be connected with is the first connection members which are disposed on uppermost semiconductor chips of the respective chip modules.

The semiconductor package may further comprise redistribution lines formed on the uppermost semiconductor chips of the respective chip modules in such a way as to be connected with the first connection members.

The semiconductor package may further comprise an encapsulant member configured to mold the upper surface of the substrate including the stacked chip modules and the second connection members; and external connection terminals attached to the ball lands which are disposed on the lower surface of the substrate.

In another embodiment of the present invention, a semiconductor package comprises a substrate having a window, first bond fingers and second bond fingers which are respectively disposed on a lower surface of the substrate adjacent to the window and on an upper surface of the substrate, and ball lands which are disposed on the lower surface of the substrate separately from the first bond fingers; at least two chip modules stacked on the upper surface of the substrate and each including a plurality of semiconductor chips having first connection members and stacked in a manner such that the first connection members of the semiconductor chips are connected to one another; and second connection members configured to connect the first connection is members of the respective chip modules to the first bond fingers and the second bond fingers of the substrate.

The first connection members of the chip modules may comprise through-electrodes.

The second connection members may comprise metal wires.

The second connection members may be connected with the first connection members which are disposed on uppermost semiconductor chips of the respective chip modules.

A lowermost chip module may be connected with the first bond fingers, which are disposed on the lower surface of the substrate, by the second connection members which pass through the window of the substrate, and chip modules, which are disposed over the lowermost chip module, may be connected with the second bond fingers, which are disposed on the upper surface of the substrate, by the second connection members.

The semiconductor package may further comprise redistribution lines formed on the uppermost semiconductor chips of the respective chip modules in such a way as to be connected with the first connection members.

The semiconductor package may further comprise an encapsulant member configured to mold the upper surface of the substrate including the stacked chip modules and the second connection members and the window; and external connection is terminals attached to the ball lands which are disposed on the lower surface of the substrate.

In another embodiment of the present invention, a semiconductor package comprises a substrate having bond fingers on an upper surface thereof and ball lands on a lower surface thereof; at least two chip modules stacked on the upper surface of the substrate and each including a plurality of semiconductor chips having first connection members and stacked in a manner such that the first connection members of the semiconductor chips are connected to one another, the chip modules being stacked in a step pattern such that connection parts of the first connection members in the chip modules project in one sideward direction; and second connection members configured to connect the first connection members of the respective chip modules and the bond fingers of the substrate.

The first connection members may comprise through-electrodes.

The second connection members may comprise metal wires.

The second connection members may be connected with the first connection members which are disposed on uppermost semiconductor chips of the respective chip modules.

The semiconductor package may further comprise redistribution lines formed on the uppermost semiconductor chips of the respective chip modules in such a way as to be connected with the first connection members.

The semiconductor package may further comprise an encapsulant member configured to mold the upper surface of the substrate including the stacked chip modules and the second connection members; and external connection terminals attached to the ball lands which are disposed on the lower surface of the substrate.

DESCRIPTION OF SPECIFIC EMBODIMENTS

Hereafter, specific embodiments of the present invention will be described in detail with reference to the accompanying is drawings.

It is understood herein that the drawings are not necessarily to scale and in some instances proportions may have been exaggerated in order to more clearly depict certain features of the invention.

Figure 1:
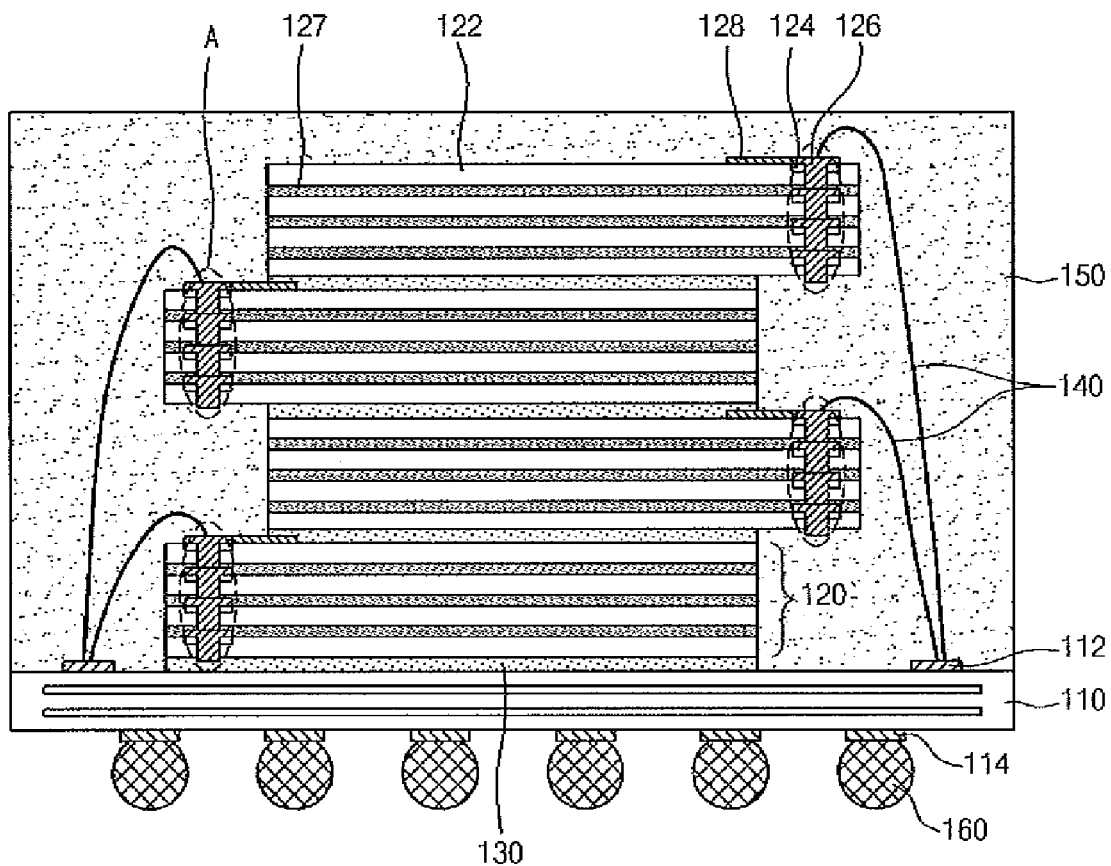
FIG. 1 is a cross-sectional view showing a semiconductor package in accordance with an embodiment of the present invention.

FIG. 1 is a cross-sectional view showing a semiconductor package in accordance with an embodiment of the present invention.

Referring to FIG. 1, a substrate 110, which has bond fingers 112 on the upper surface thereof and ball lands 114 on the lower surface thereof, is prepared. A plurality of chip modules 120 are stacked on the upper surface of the substrate 110 by, for example, the medium of adhesive members 130.

Each chip module 120 includes at least two semiconductor chips 122 (for example, four semiconductor chips 122 in the embodiment shown in FIG. 1). Each of the semiconductor chips 122 of a module includes at least one bonding pad 124 and at least one through-electrode 126 formed through the bonding pad 124. The semiconductor chips 122 are stacked in such a way as to allow their respective through-electrodes 126 to be electrically connected to one another. The semiconductor chips 122 of the chip modules 120 are a one side edge pad type in which the bonding pads 124 are arranged adjacent to one edge of each semiconductor chip 122. In an embodiment, the chip modules 120 are stacked in a zigzag pattern such that through-electrode connection parts A of the respective chip modules 120 project leftward and rightward in an alternate manner. For example, adhesives 127 can be interposed between the stacked semiconductor chips 122 in an embodiment of the present invention. Alternative insulation substances can also be interposed in place of the adhesives 127.

The respective stacked chip modules 120 and the substrate 110 are electrically connected to each other by metal wires 140. The metal wires 140 are formed in such a way as to electrically connect the through-electrodes 126 of the semiconductor chip 122 positioned uppermost in each chip module 120 to the bond fingers 112 of the substrate 110.

The upper surface of the substrate 110 including the stacked chip modules 120 and the metal wires 140 is molded by an encapsulant member 150. The encapsulant member 150 is formed of a substance such as, for example, an EMC (epoxy molding compound). In an embodiment, solder balls 160 as external connection terminals are attached to the ball lands 114 which are disposed on the lower surface of the substrate 110, for example.

In an embodiment, redistribution lines 128 are additionally to formed on the semiconductor chip 122 positioned uppermost in each chip module 120 in such a way as to be electrically connected to the corresponding through-electrodes 126 so as to allow a preliminary test for the chip module 120 to be easily executed.

In the semiconductor package 100 in accordance with an embodiment of the invention, the semiconductor chips 120 to be included in a chip module 120 undergo preliminary testing to determine whether the semiconductor chips 120 are good dies. In particular, only the chip modules 120 which are tested by a module unit and are proved to be free from defects are stacked on the substrate 110.

Therefore, in the semiconductor package in accordance with an embodiment of the invention, since the semiconductor chips are stacked after being preliminarily tested, the manufacturing yield can be significantly increased when compared to the conventional art, and since an increased number of semiconductor chips can be mounted, high density mounting can be ensured.

Also, as will be described later, in the semiconductor package in accordance with embodiments of the invention, because the plurality of chip modules are manufactured in advance and are then electrically connected to the bond fingers of the substrate through a wire bonding process, the semiconductor package can be manufactured relatively easily.

FIGS. 2A through 2F are cross-sectional views shown for to illustrating the processes of a method for manufacturing a semiconductor package in accordance with another embodiment of the present invention. The method will be described below.

Figure 2A:
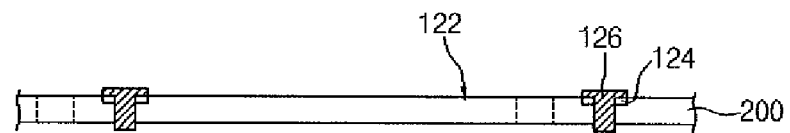
FIGS. 2A through 2F are cross-sectional views shown for illustrating the processes of a method for manufacturing a semiconductor package in accordance with another embodiment of the present invention.

Referring to FIG. 2A, a wafer 200 including a plurality of semiconductor chips 122, which have completely undergone semiconductor chip manufacturing processes, is prepared. The semiconductor chips 122 are a one side edge pad type in which bonding pads 124 are disposed adjacent to one edge of each semiconductor chip 122. Each semiconductor chip 122 has through-electrodes 126 which extend from the upper surface including the bonding pads 124 to the lower surface thereof.

For example, in an embodiment the through-electrodes 126 can be formed by defining grooves on the upper surface of each semiconductor chip 122 at a wafer level with the grooves passing through the bonding pads 124 and extending to a predetermined depth; filling a metal layer in the grooves; and then back-grinding the lower surface of the wafer 200 in such a way as to expose the lower ends of the grooves in which the metal layer is filled. Further, as the occasion demands, an etch-back process can be conducted for the lower surface of the back-grinded wafer 200 such that the through-electrodes 126 project from the lower surface of the wafer as in the embodiment of the present invention shown in FIG. 2A.

Figure 2B:
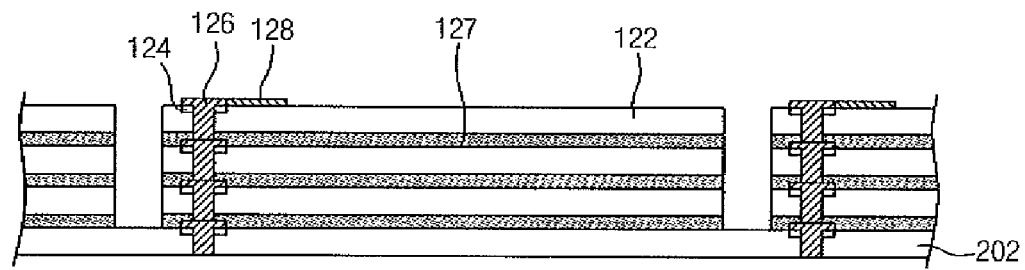

Referring to FIG. 2B, a wafer sawing process is conducted such that the wafer 200 is segmented into the semiconductor chips 122 each having the through-electrodes 126; and then, the semiconductor chips 122 are tested and sorted to identify good dies. Thereupon, a new wafer 202 including a plurality of semiconductor chips 122 determined to be good dies through a test is prepared, and the sawed semiconductor chips 122 are stacked in a plural number on individual semiconductor chips 122 of the wafer 202. For example, in an embodiment, three semiconductor chips 122 are stacked on the individual semiconductor chips 122 of the wafer 202.

In an embodiment, the stacking of the semiconductor chips 122 may be conducted by the medium of adhesives 127 or corresponding insulation substances. The semiconductor chips 122 are stacked in a manner such that the through-electrodes 126 of the respective semiconductor chips 122 are electrically connected to one another.

Redistribution lines 128 are formed on the semiconductor chip 122 which is positioned uppermost among the stacked semiconductor chips 122, in such a way as to be electrically connected to the through-electrodes 126. The redistribution lines 128 can be formed in a variety of ways to allow for a subsequent test.

Figure 2C:
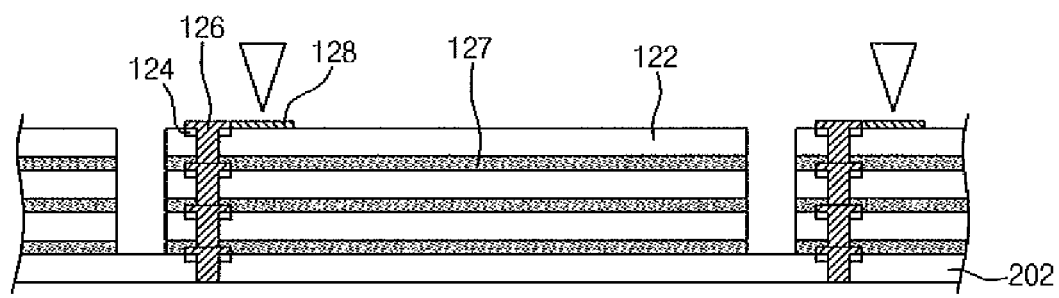
Figure 2D:
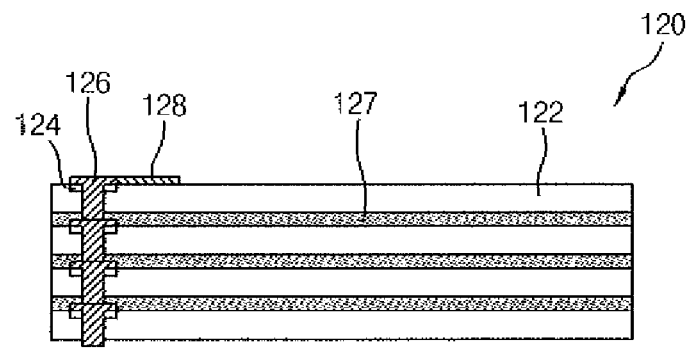

Referring to FIG. 2C, a test is executed for the stacked semiconductor chips 122 using the redistribution lines 128 which are formed on the uppermost semiconductor chip 122. Upon testing the chip stacks, the chip stacks in which even one of all the stacked semiconductor chips 122 has a defect are sorted from chip stacks in which all the stacked semiconductor chips 122 are free from defects.

Referring to FIG. 2D, by conducting again a wafer sawing process for the resultant structure having undergone the test, a plurality of chip modules 120, in which a plurality of semiconductor chips 122 (for example, four semiconductor chips 122) are stacked, are manufactured. The chip modules 120 can be understood as being free from defects in all of the stacked semiconductor chips 122 thereof.

Figure 2E:
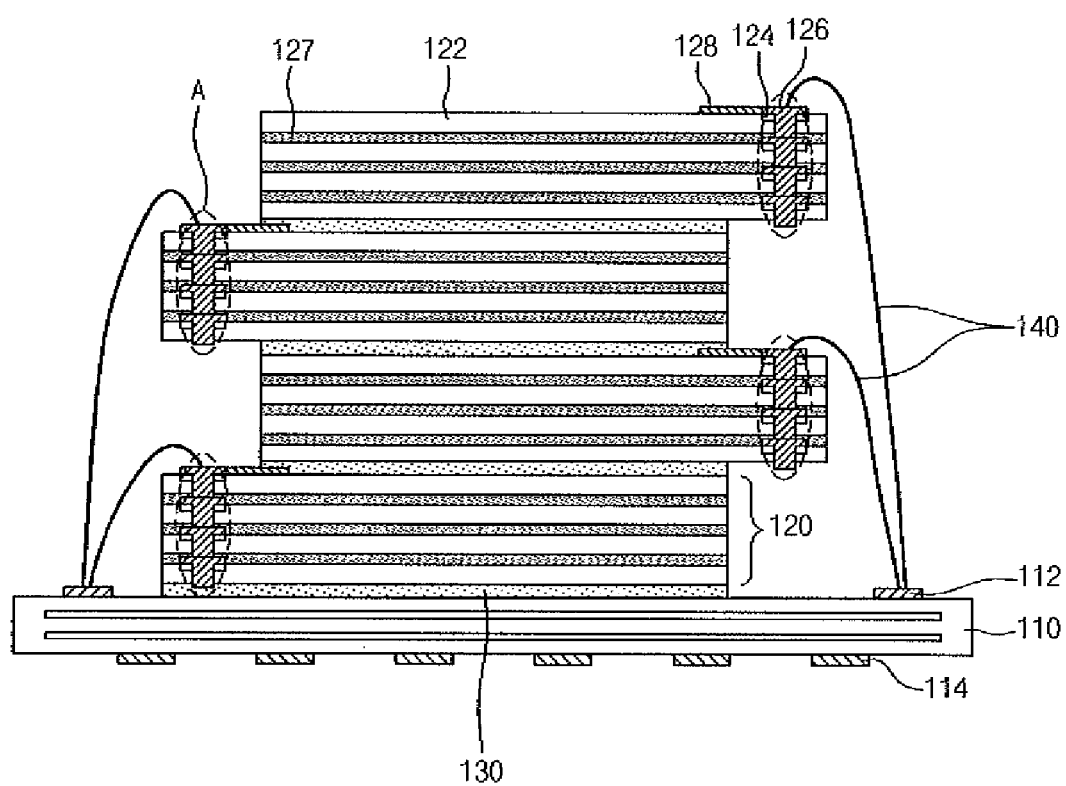

Referring to FIG. 2E, a substrate 110, which, in an embodiment, has bond fingers 112 on the upper surface thereof and ball lands 114 on the lower surface thereof, is prepared. Then, at least two chip modules 120 (for example, four chip modules 120 as in the embodiment shown in FIG. 2E) which are free from defects and each of which comprises a stack of the semiconductor chips 122, are stacked on the upper surface of the substrate 110 by, for example, the medium of adhesive members 130. The chip modules 120 are stacked in a zigzag pattern such that through-electrode connection parts A of the respective chip modules 120 project leftward and rightward in an alternate manner.

The through-electrode connection parts A of the respective stacked chip modules 120 and the bond fingers 112 of the substrate 110 are connected through a wire bonding process by the medium of metal wires 140. In detail, the metal wires 140 electrically connect the through-electrodes 126 of the semiconductor chip 122 positioned uppermost in each chip module 120 to the bond fingers 112 of the substrate 110.

Figure 2F:
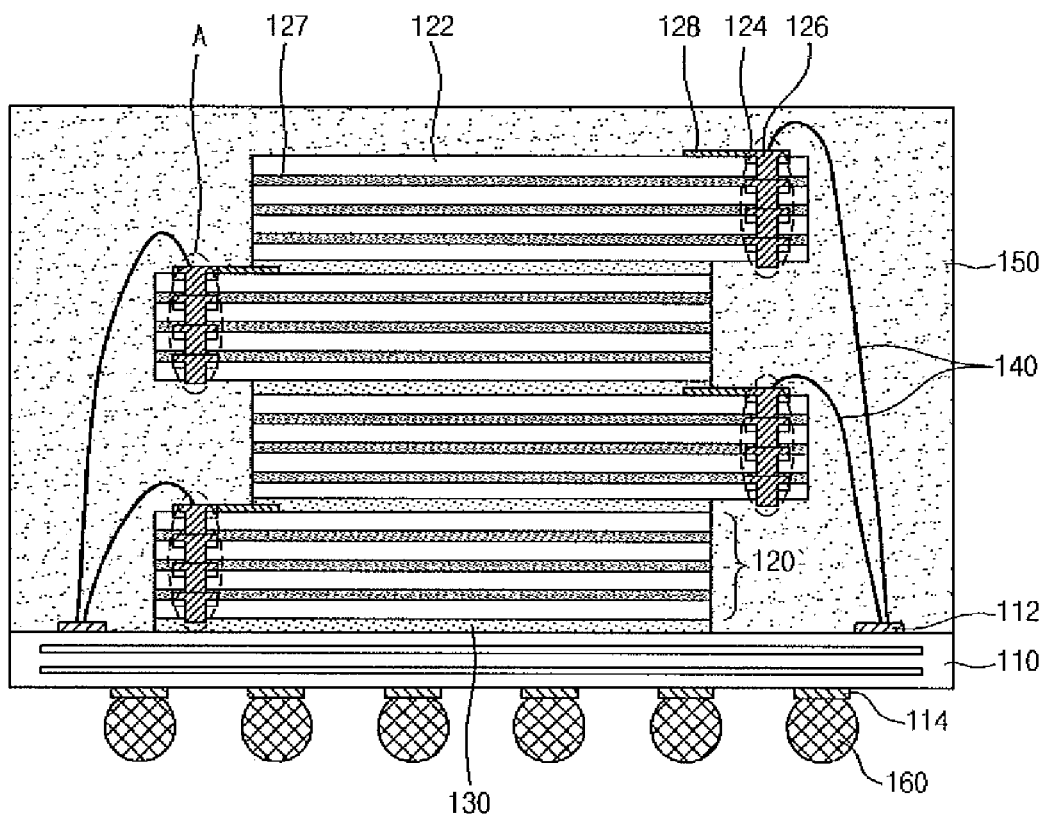

Referring to FIG. 2F, the upper surface of the substrate 110 including the stacked chip modules 120 and the metal wires 140 is molded by an encapsulant member 150, for example, such as an EMC (epoxy molding compound). In an embodiment, solder balls 160 as external connection terminals may be attached to the ball lands 114 which are disposed on the lower surface of the substrate 110.

In the semiconductor package in accordance with an embodiment of the present invention, after manufacturing a plurality of chip modules each having a desired number of semiconductor chips to stack, tests are conducted in advance for the chip modules, and then, only the chip modules, which are proved through the tests to be free from defects, are stacked. As a consequence, high density and high manufacturing yield can be ensured.

Further, in the semiconductor package in accordance with the embodiment of the present invention, since the chip modules are electrically connected to the substrate through the wire bonding process, the semiconductor package can be easily manufactured at a reduced cost.

Figure 3:
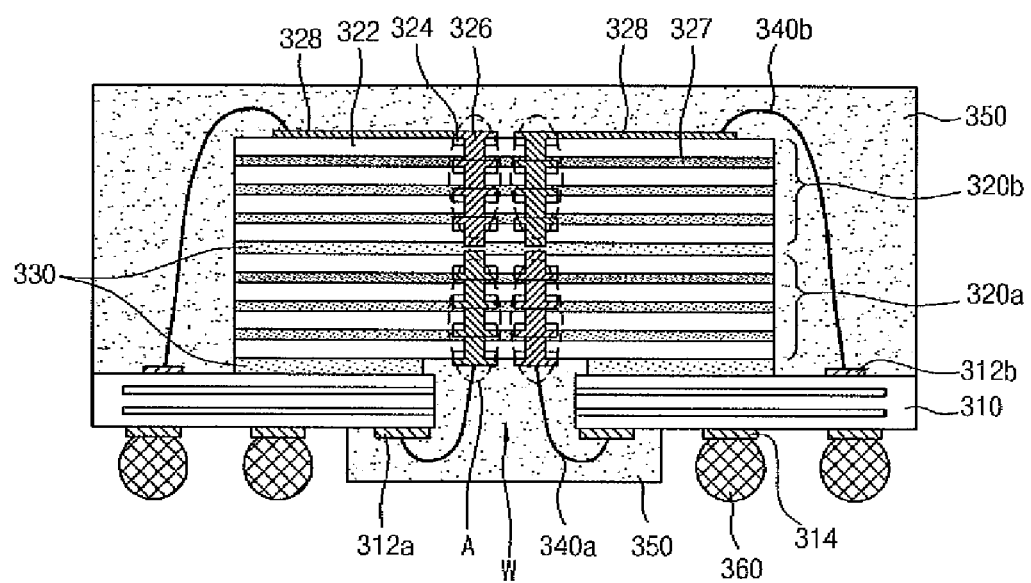
FIG. 3 is a cross-sectional view showing a semiconductor package in accordance with another embodiment of the present invention.

FIG. 3 is a cross-sectional view showing a semiconductor package in accordance with another embodiment of the present invention.

Referring to FIG. 3, a substrate 310 is prepared, which is defined with a window W at the center portion thereof and has first bond fingers 312a and second bond fingers 312b disposed on the lower surface of the substrate 310 adjacent to the window W and on the upper surface of the substrate 310 respectively, and ball lands 314 disposed on the lower surface of the substrate 310 separately from the first bond fingers 312a. At least two chip modules (for example, two chip modules 320a and 320b) are stacked on the upper surface of the substrate 310.

The chip modules 320a and 320b are a center pad type in which bonding pads 324 are disposed on the center portion, and has a structure in which at least two semiconductor chips 322 (for example, four semiconductor chips 322 in the embodiment shown in FIG. 3) each having at least one through-electrode 326 passing through a bonding pad 324 are stacked by, for example, the medium of adhesives 327 or corresponding insulation substances, such that the through-electrodes 326 of the respective semiconductor chips 322 are electrically connected to one another. At this time, as shown in the drawing, the lower chip module 320a which is positioned downward is placed in a face-down type (e.g., bonding pads are facing down), and the upper chip module 320b which is positioned over the lower chip module 320a is placed in a face-up type (e.g., bonding pads are facing up). While the upper chip module 320b may also be placed in face-down type. As in the aforementioned embodiment, the respective chip modules 320a and 320b can be understood as being proved through the preliminary tests to be free from defects in all of the stacked semiconductor chips 322 thereof.

In an embodiment, redistribution lines 328 are formed on the semiconductor chip 322 positioned uppermost in the chip module 320b in such a way as to be electrically connected to the through-electrodes 326 so as to allow for preliminary tests for the chip modules 320b to be easily executed. In an embodiment, a redistribution may also be formed on the uppermost semiconductor chip of the chip module 320a (the uppermost semiconductor chip in this case being the semiconductor chip closest to the substrate since the semiconductor chips of the chip module 320a are facing downward) to allow for preliminary tests. While the redistribution lines 328 may also be formed on the semiconductor chip 322 positioned lowermost in the chip module 320b in such a way as to be electrically connected to the through-electrodes 326.

Through-electrode connection parts A of the chip modules 320a and 320b include bonding pads of the semiconductor chips 322 of respective chip modules 320a and 320b. Through-electrode connection parts A of the lower chip module 320a, more precisely, the through-electrodes 326 of the semiconductor chip 322 positioned uppermost among the semiconductor chips 322 stacked in the lower chip module 320a, and the first bond fingers 312a of the substrate 310 are electrically connected to each other by first metal wires 340a. Further, through-electrode connection parts A in the upper chip module 320b, more precisely, the through-electrodes 326 of the semiconductor chip 322 positioned uppermost among the semiconductor chips 322 stacked in the upper chip module 320b, and the second bond fingers 312b of the substrate 310 are electrically connected to each other by second metal wires 340b by the medium of the redistribution lines 328. When the redistribution lines 328 are formed on the semiconductor chip 322 positioned lowermost in the chip module 320b, the redistribution lines 328 may also be connected to the second bond fingers 312b of the substrate 310 by the metal wires 340b.

The window W of the substrate 310 including the first metal wires 340a and the upper surface of the substrate 310 including the stacked chip modules 320a and 320b and the second metal wires 340b are molded by an encapsulant member 350, for example, such as an EMC. In an embodiment, solder balls 360 as external connection terminals are attached to the ball lands 314 which are disposed on the lower surface of the substrate 310.

In the semiconductor package in accordance with the is embodiment of the present invention, since only the chip modules each including a stack of semiconductor chips which are proved in advance through tests to be free from defects are stacked, high density and high manufacturing yield can be ensured. Further, since the chip modules are electrically connected to the substrate through the metal wires, the semiconductor package can be easily manufactured.

Figure 4:
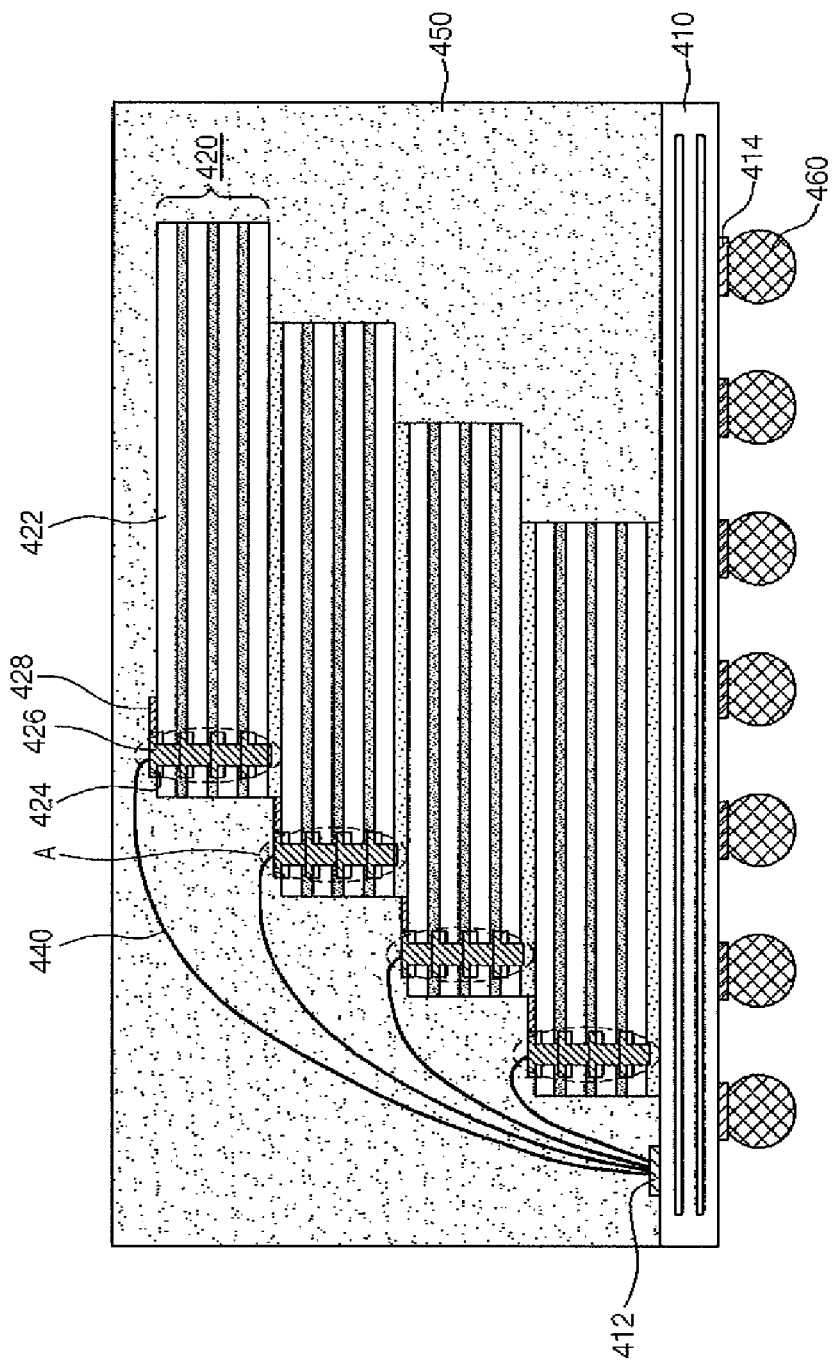
FIG. 4 is a cross-sectional view showing a semiconductor package in accordance with another embodiment of the present invention.

FIG. 4 is a cross-sectional view showing a semiconductor package in accordance with another embodiment of the present invention.

Referring to FIG. 4, a plurality of chip modules 420, each of which comprises a plurality of semiconductor chips (for example, four semiconductor chips 422 in the embodiment shown in FIG. 4) stacked such that through-electrodes 426 of the respective semiconductor chips 422 are electrically connected to one another, are stacked in a step pattern on the upper surface of a substrate 410. In the embodiment shown in FIG. 4, the substrate 410 has bond fingers 412 on the upper surface thereof and ball lands 414 on the lower surface thereof. The semiconductor chips 422 of the respective chip modules 420 are a one side edge pad type in which bonding pads 424 are arranged adjacent to one edge of each semiconductor chip 422. Through-electrode connection parts A of the respective chip modules 420 are disposed on the surfaces of steps. Redistribution lines 428 are formed on the semiconductor to chips 422 positioned uppermost in the respective chip modules 420 in such a way as to be electrically connected to the through-electrodes 426 so as to allow preliminary tests for the chip modules 420 to be easily executed.

The through-electrode connection parts A of the respective chip modules 420 and the bond fingers 412 of the substrate 410 are electrically connected by metal wires 440. The upper surface of the substrate 410 including the plurality of chip modules 420 stacked in the step pattern and the metal wires 440 are molded by an encapsulant member 450, for example, such as an EMC. In an embodiment, solder balls 460 as external connection terminals are attached to the ball lands 414 which are disposed on the lower surface of the substrate 410.

In the semiconductor package in accordance with embodiments of the present invention, since only the chip modules each composed of the stack of semiconductor chips, which are proved in advance through the tests to be free from defects, are stacked, high density and high manufacturing yield can be ensured. Further, since the chip modules are electrically connected to the substrate through the metal wires, the semiconductor package can be easily manufactured.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
 a substrate having bond fingers on an upper surface thereof;
 at least two chip modules stacked on the upper surface of the substrate, each of the at least two chip modules including:
  a plurality of semiconductor chips having first connection members and stacked in a manner such that the first connection members of the semiconductor chips are electrically connected to one another, the first connection to members of the plurality of semiconductor chips being a connection part of the chip module,
 the chip modules being stacked in a zigzag pattern such that the connection parts of the respective chip modules project sideward; and
 second connection members electrically connecting the connection parts of the respective chip modules to the bond fingers of the substrate.

2. The semiconductor package according to claim 1, wherein the first connection members comprise through-electrodes.

3. The semiconductor package according to claim 1, wherein the second connection members comprise metal wires.

4. The semiconductor package according to claim 1, wherein the second connection members are connected to the first connection members of uppermost semiconductor chips of the respective chip modules.

5. The semiconductor package according to claim 1, further comprising:
   redistribution lines formed on uppermost semiconductor chips of the respective chip modules in such a way as to be electrically connected to the first connection members.

6. The semiconductor package according to claim 1, further comprising:
   an encapsulant member formed over the upper surface of the is substrate including the stacked chip modules and the second connection members;
   ball lands disposed on a lower surface of the substrate; and
   external connection terminals attached to the ball lands which are disposed on the lower surface of the substrate.

7. A semiconductor package comprising:
   a substrate having a window, a first bond finger disposed on a lower surface of the substrate, and a second bond finger disposed on an upper surface of the substrate;
   at least two chip modules stacked on the upper surface of the substrate, each of the at least two chip modules including:
      a plurality of semiconductor chips having first connection members and stacked in a manner such that the first connection members of the semiconductor chips are electrically connected to one another; and
   second connection members electrically connecting the first connection members of the respective chip modules to the first bond finger and the second bond finger of the substrate.

8. The semiconductor package according to claim 7, wherein the first connection members comprise through-electrodes.

9. The semiconductor package according to claim 7, wherein the is second connection members comprise metal wires.

10. The semiconductor package according to claim 7, wherein the second connection members are electrically connected to the first connection members of uppermost semiconductor chips of the respective chip modules.

11. The semiconductor package according to claim 7, wherein: a lowermost chip module of the at least two chip modules is electrically connected to the first bond finger, which is disposed on the lower surface of the substrate, by the second connection members which pass through the cavity of the substrate, and a chip module of the at least two chip modules, which is disposed over the lowermost chip module, is electrically connected to the second bond finger, which is disposed on the upper surface of the substrate, by the second connection members.

12. The semiconductor package according to claim 7, further comprising:
   redistribution lines formed on uppermost semiconductor chips of the respective chip modules in such a way as to be electrically connected to the first connection members.

13. The semiconductor package according to claim 7, further is comprising:
   an encapsulant member formed over the upper surface of the substrate including the stacked chip modules, the second connection members, and the window;
   ball lands disposed on a lower surface of the substrate and separated from the first bond finger; and
   external connection terminals attached to the ball lands which are disposed on the lower surface of the substrate.

14. A semiconductor package comprising:
   a substrate having bond fingers on an upper surface thereof;
   at least two chip modules stacked on the upper surface of the substrate, each of the at least two chip modules including:
      a plurality of semiconductor chips having first connection members and stacked in a manner such that the first connection members of the semiconductor chips are electrically connected to one another, the first connection members of the plurality of semiconductor chips being a connection part of the chip module,
   the chip modules being stacked in a step pattern such that the connection parts of the respective chip modules project in one sideward direction; and
   second connection members connecting the connection parts of the respective chip modules to the bond fingers of the substrate.

15. The semiconductor package according to claim 14, wherein the first connection members comprise through-electrodes.

16. The semiconductor package according to claim 14, wherein the second connection members comprise metal wires.

17. The semiconductor package according to claim 14, wherein the second connection members are connected to the first connection members of uppermost semiconductor chips of the respective chip modules.

18. The semiconductor package according to claim 14, further comprising:
   redistribution lines formed on uppermost semiconductor chips of the respective chip modules in such a way as to be electrically connected to the first connection members.

19. The semiconductor package according to claim 14, further comprising:
   an encapsulant member formed over the upper surface of the substrate including the stacked chip modules and the second connection members;
   ball lands disposed on a lower surface of the substrate; and
   external connection terminals attached to the ball lands which are disposed on the lower surface of the substrate.

* * * * *